US009656482B2

(12) United States Patent
Bamba et al.

(10) Patent No.: US 9,656,482 B2
(45) Date of Patent: May 23, 2017

(54) SURFACE MODIFIER FOR POLYIMIDE RESIN AND SURFACE-MODIFYING METHOD FOR POLYIMIDE RESIN

(71) Applicant: SEIREN CO., LTD., Fukui (JP)

(72) Inventors: Akimitsu Bamba, Fukui (JP); Takuya Arita, Fukui (JP); Hiroyuki Hayashi, Fukui (JP); Kouichi Kugimiya, Fukui (JP)

(73) Assignee: SEIREN CO., LTD., Fukui (JP)

( * ) Notice: Subject to any disclaimer, the term of this patent is extended or adjusted under 35 U.S.C. 154(b) by 0 days.

(21) Appl. No.: 15/042,590

(22) Filed: Feb. 12, 2016

(65) Prior Publication Data

US 2016/0159112 A1    Jun. 9, 2016

Related U.S. Application Data

(62) Division of application No. 14/176,309, filed on Feb. 10, 2014, now abandoned.

(30) Foreign Application Priority Data

Feb. 13, 2013 (JP) ................. 2013-025603
Feb. 13, 2013 (JP) ................. 2013-025604

(51) Int. Cl.
  *G03F 7/00*   (2006.01)
  *B41J 11/00*  (2006.01)
  (Continued)

(52) U.S. Cl.
  CPC .......... *B41J 11/0015* (2013.01); *B41F 15/00* (2013.01); *H05K 3/182* (2013.01); *G03F 7/00* (2013.01)

(58) Field of Classification Search
  None
  See application file for complete search history.

(56) References Cited

U.S. PATENT DOCUMENTS 4,873,136 A  * 10/1989 Foust ............... C23C 18/22
                                         205/126
5,091,103 A  *  2/1992 Dean ............... G03F 7/425
                                         510/175
(Continued)

FOREIGN PATENT DOCUMENTS

JP    2001055570 A  *  2/2001
JP    2005-29735        2/2005
(Continued)

OTHER PUBLICATIONS

Oyama, T. et al., "Photosensitive Polyimide-silicone Copolymer based on Reaction Development Patterning (RDP)", J. Photopolym. Sci. Technol. 2016, 29(2), 273-276.*

(Continued)

*Primary Examiner* — Richard A Huhn
(74) *Attorney, Agent, or Firm* — Wenderoth, Lind & Ponack, L.L.P.

(57) ABSTRACT

The present invention relates to a polyimide resin surface modifier which modifies the surface of a polyimide resin to permit easy absorption of metal ions, and a surface-modifying method for polyimide resins using the same. The surface modifier contains an alkali component, an organic solvent having hydroxy groups and a boiling point of 120° C. or higher, and a water content of 0-10% by weight. The surface-modifying method includes a printing process wherein a predetermined pattern is printed on the surface of a polyimide resin substrate using the polyimide resin surface modifier, an organic solvent-removing process wherein an organic solvent in the polyimide resin surface modifier pattern-printed on the surface of said polyimide resin substrate is removed and a water-treatment process wherein said polyimide resin surface modifier after removing the organic solvent is brought into contact with water.

8 Claims, 1 Drawing Sheet

(51) Int. Cl.
  *H05K 3/18*  (2006.01)
  *B41F 15/00* (2006.01)

(56) References Cited

U.S. PATENT DOCUMENTS 5,342,739 A  *  8/1994  Katou .................... G03F 7/0757
                                                      430/192
6,403,289 B1 *  6/2002  Tanaka .................... G03F 7/322
                                                      430/322

FOREIGN PATENT DOCUMENTS

| | | |
|---|---|---|
| JP | 2005-45236 | 2/2005 |
| JP | 3825790 | 7/2006 |
| JP | 2008-53682 | 3/2008 |
| JP | 2011-14801 | 1/2011 |

OTHER PUBLICATIONS

Kameda, T. et al. "Sodium Hydroxide-Assisted Dechlorination of a Poly(Vinylidene Chloride)-Containing Wrapping Film in Ethylene Glycol Solution," Polymer Degradation and Stability 2010, 95, 2663-2665.

* cited by examiner

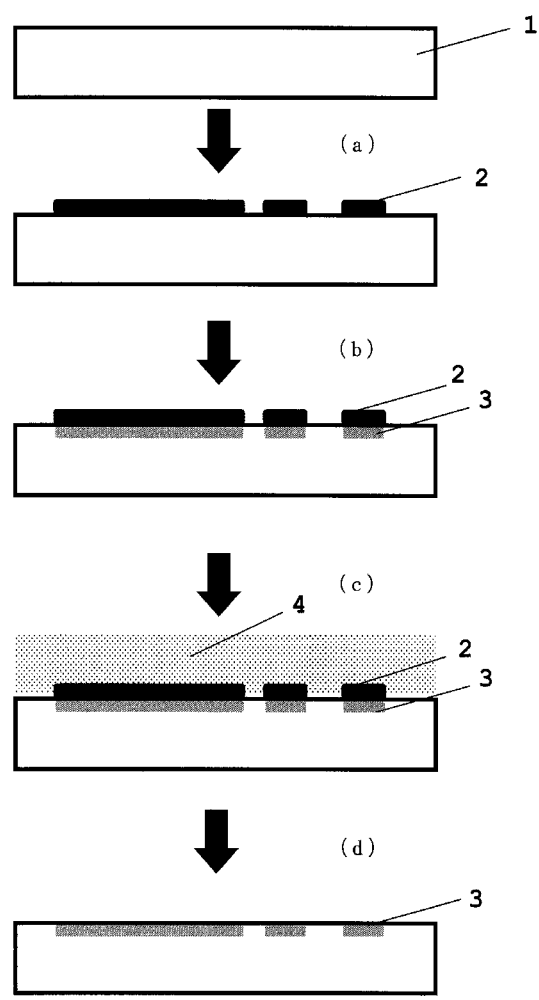

SURFACE MODIFIER FOR POLYIMIDE RESIN AND SURFACE-MODIFYING METHOD FOR POLYIMIDE RESIN

TECHNICAL FIELD

The present invention relates to a surface modifier for polyimide resins for modifying the surface of a polyimide resin so that metal ions can be adsorbed easily, and a surface-modifying method for polyimide resins using the same.

BACKGROUND ART

In the field of electronic components, decorating items or the like, resin materials with a metal film pattern formed thereon have been used from many years ago. Typical examples thereof include a flexible printed-wiring board wherein a metal film circuit pattern is formed on the surface of a resin film.

Along with the miniaturization of electronic equipment, the miniaturization of flexible printed-wiring boards has also been developed and it has been required to form a finer circuit pattern. At the same time, in addition, it has also been required to improve the adhesiveness of the metal film to the resin film surface.

As a typical method for forming a circuit pattern, it has been known a method wherein a metal film is formed on a whole surface of a polyimide resin film by means of vapor deposition, sputtering or laminating a copper foil using an adhesive, then the metal film is exposed in pattern by a photolithography method, being developed, and the unnecessary metal is removed by etching.

However, this method has such problems as a low productivity cause by the great mass of metal to be removed, heavy effects on the environment caused by etching waste liquid and high cost of equipment and material such as photomasks, exposure devices, and photoresist.

Attention has been focused on a pattern printing technology using a metal nano-ink. The metal nano-ink and/or paste can be patterned on a substrate by an inkjet printing method or a screen printing method, whereby a conductive pattern can be formed directly thereon. However, the method also has such problems that the cost of raw material is high and that a calcination process is required after printing and therefore the substrate to be used is restricted to be one of heat resistant. In addition, specific resistance of the conductive pattern thus formed is higher compared with that formed by plating, which may cause a problem from the aspect of electric characteristics for applications for electronic equipment.

As a means for solving the above problems, in recent years, attention has been focused on a direct metallization method as disclosed in Patent Documents 1, 2 and 3, in which an imide ring of a polyimide resin film is opened by treating the surface of the polyimide resin film with alkali, then metal salts are adsorbed to the carboxyl group formed by opening the imide ring, and the metal salts are reduced to deposit a metal film.

Patent Documents 4 and 5 disclose a method wherein an alkaline ink is applied by an inkjet method selectively to a polyimide resin substrate at the part for forming the inorganic thin film to open the imide ring, then metal ions are adsorbed to said part to form metal salts, and then the metal salts are reduced to form an inorganic thin film pattern.

According to the method, it is not necessary to remove the metal film of the unnecessary part by etching after forming a metal film on the whole surface of the polyimide resin substrate.

PRIOR ART DOCUMENTS

Patent Document

Patent Document 1: Jpn. Pat. No. 3825790
Patent Document 2: Jpn. Pat. Laid-Open Publication No. 2008-053682
Patent Document 3: Jpn. Pat. Laid-Open Publication No. 2011-014801
Patent Document 4: Jpn. Pat. Laid-Open Publication No. 2005-029735
Patent Document 5: Jpn. Pat. Laid-Open Publication No. 2005-045236

DISCLOSURE OF THE INVENTION

Problems to be Solved by the Invention

However, the methods disclosed in Patent Documents 1-3 also require an etching process, similar to the conventional methods, because a metal film is formed on the whole surface of the substrate in advance and then the metal film is patterned.

By the etching process, the interfacial surface between the patterned metal film and the resin substrate might be corroded to form under-etch, which might cause deterioration of adhesion of metal film and also might cause degradation of electromigration resistance after forming a pattern plate since the metal film is formed on the whole surface in advance. An influence of these problems becomes high as the metal film pattern becomes fine.

There is a method wherein an alkaline aqueous solution is applied in a pattern shape to form a metal film only on the necessary part from the first. However, a strongly alkaline aqueous solution capable of opening the imide ring would give a heavy burden to a printer. For example, a photosensitive emulsion which is used for a printing plate for screen printing would easily suffer damage by a strongly alkaline agent, which might cause deterioration of printing precision. In the inkjet method disclosed in Patent Documents 4 and 5, using a strongly alkaline ink would cause not only corrosion of a head body but also damage to a liquid repellent polymer layer on the orifice plate of an inkjet head for discharging ink and would cause a deterioration of ink discharging performance.

In the case of using a solvent modifier containing organic alkali in which alkali dissociation is suppressed for preventing damage to a screen printing plate, alkali hydrolysis reaction on the surface of a polyimide resin would not progress sufficiently, and as a result, modification ability would be deteriorated which would cause a low modification degree and/or would cause modification ununiformity.

The problem to be solved by the present invention is to provide a polyimide resin surface modifier having a sufficient modification ability which can minimize damage to a printing plate and/or a printer and can open imide rings on the surface of a polyimide resin sufficiently, and to provide a surface-modifying method for a polyimide resin using said polyimide resin surface modifier.

Means for Solving the Problems

That is, the present invention provides a polyimide resin surface modifier and a surface-modifying method for a polyimide resin shown as follows:

(1) A polyimide resin surface modifier which contains an alkali component and an organic solvent having hydroxy groups and a boiling point of 120° C. or higher, wherein the water content is 0-10% by weight.
(2) The polyimide resin surface modifier according to (1), which further contains a water-soluble polymer compound.
(3) The polyimide resin surface modifier according to (1) or (2), wherein said alkali component is selected from the group consisting of an alkali metal hydroxide and a quaternary ammonium hydroxide.
(4) The polyimide resin surface modifier according to (1) or (2), wherein said organic solvent is an alcoholic compound.
(5) The polyimide resin surface modifier according to (4), wherein said alcoholic compound is selected from the group consisting of hydrocarbon-type alcohols, alkylene glycols and glycol ethers.
(6) The polyimide resin surface modifier according to (2), wherein said water-soluble polymer compound is selected from the group consisting of polyvinyl pyrrolidone, polyvinyl alcohol and carboxy methylcellulose.
(7) A surface-modifying method for a polyimide resin which comprises
a printing process wherein a predetermined pattern is printed on the surface of a polyimide resin substrate using a polyimide resin surface modifier containing an alkali component and an organic solvent having hydroxy groups and a boiling point of 120° C. or higher wherein the water content is 0-10% by weight,
an organic solvent-removing process wherein an organic solvent in the polyimide resin surface modifier pattern-printed on the surface of said polyimide resin substrate is removed and
a water-treatment process wherein said polyimide resin surface modifier after removing the organic solvent is brought into contact with water.
(8) The surface-modifying method for a polyimide resin according to (7), wherein said polyimide resin surface modifier further contains a water-soluble polymer compound.
(9) The surface-modifying method for a polyimide resin according to (7) or (8), wherein said printing is carried out by a screen printing method.
(10) The surface-modifying method for a polyimide resin according to (7) or (8), wherein said printing is carried out by an inkjet printing method.

Effect of the Invention

According to the polyimide resin surface modifier and the surface-modifying method for a polyimide resin using the same of the present invention, modification can be carried out in a predetermined pattern on the polyimide resin surface without damaging to a printing plate and/or printer by an alkaline component in the printing process. In addition, by contacting with water to dissociate the alkaline component in the polyimide resin surface modifier after the printing process, alkali hydrolysis reaction on the polyimide resin surface in a predetermined pattern can be promoted and uniform modification of the polyimide resin surface can be achieved sufficiently.
The metal film obtained by reducing metal ions adsorbed on the polyimide resin surface which is surface-modified by the surface-modifying method using the polyimide resin surface modifier of the present invention does not have under-etch, since an etching process is not required. In addition, since the metal film is formed only on the predetermined pattern part, electromigration resistance can be ensured.

BRIEF DESCRIPTION OF DRAWINGS

FIG. 1 shows an outline of one embodiment of the surface-modifying method for a polyimide resin using the polyimide resin surface modifier of the present invention.

EXPLANATION OF REFERENCE LETTERS

1: Polyimide resin substrate
2: Polyimide resin surface modifier
3: Modified part which is modified in the form of a pattern by the polyimide resin surface modifier
4: Water

MODES FOR CARRYING OUT THE INVENTION

1. Polyimide Resin Surface Modifier

The polyimide resin surface modifier of the present invention contains an alkali component and an organic solvent having hydroxy groups and a boiling point of 120° C. or higher as necessary components.
(1) Alkali Component
The alkali component used in the present invention is a compound which shows an alkaline property by dissolving in water. The alkali component used in the present invention can be an organic compound or can be an inorganic compound. Preferable examples of the inorganic alkali compounds include metal hydroxide or nonmetal hydroxide. Preferable examples of the organic alkali compounds include quaternary ammonium hydroxide.
Examples of quaternary ammonium hydroxide include tetramethylammonium hydroxide (TMAH), tetraethylammonium hydroxide (TEAH), tetrapropylammonium hydroxide (TPAH) and tetrabutylammonium hydroxide (TBAH).
Examples of metal hydroxide and nonmetal hydroxide include alkali metal hydroxide such as sodium hydroxide and potassium hydroxide; alkali earth metal hydroxide such as magnesium hydroxide and calcium hydroxide; and ammonium hydroxide.
It is preferable to use an alkali component selected from the group consisting of alkali metal hydroxide and quaternary ammonium hydroxide.
Among them, it is most preferable to use tetramethylammonium hydroxide (TMAH) and tetrabutylammonium hydroxide (TBAH) as the quaternary ammonium hydroxide, and sodium hydroxide (NaOH) and potassium hydroxide (KOH) as the alkali metal hydroxide, in terms of solubility in a solvent.
The content of the alkali component based on the total amount of polyimide resin surface modifier of the present invention is preferably 0.1-10% by weight, more preferably 1-5% by weight, in terms of converted value to KOH. By adjusting the content of the alkali component in this range, sufficient surface modification of the polyimide resin substrate can be achieved without damaging to a printer.
The content of the alkali component in terms of converted value to KOH can be determined by the following mathematical formula:

$$A(KOH) = A_0 \times [M(KOH)/M(A)] \quad \text{(Mathematical Formula)}$$

$A_0$: Content of the alkali component (% by weight)
$A(KOH)$: Content of alkali component in terms of converted value to KOH (% by weight)

M(KOH): Molecular weight of KOH (=56.12)
M(A): Molecular weight of alkali component (2) Organic Solvent The organic solvent used in the present invention is required to have a boiling point of 120° C. or higher in terms of handleability in the printing process. When using the organic solvent having a boiling point less than 120° C., the fluidity of the polyimide resin surface modifier might be lowered in the printing process. This might cause deterioration of printing quality and might cause difficulty in forming a precise pattern.

Electrical polarity is required for the organic solvent so that the alkali component can be dissolved stably, and therefore, the presence of hydroxy groups in a molecule is required.

Furthermore, the organic solvent is required to be able to dissolve or disperse the alkali component.

As the organic solvent having hydroxy groups and a boiling point of 120° C. or higher of the present invention, it is preferable to use an alcoholic compound. As the alcoholic compound, it is more preferable to use alcohols selected from the group consisting of hydrocarbon-type alcohols, alkylene glycols and glycol ethers.

Examples of the hydrocarbon-type alcohols include a compound derived from acyclic saturated hydrocarbon, preferably alcohol derived from acyclic saturated hydrocarbon having 5-10 carbon atoms, more preferably primary alcohol having 5-9 carbon atoms. More precisely, examples of the hydrocarbon-type alcohols include alcohol having a boiling point of 120° C. or higher among the isomers of C5 pentanol and C6 hexanol. Preferable examples thereof include 1-pentanol having a boiling point of 138° C., 1-hexanol having a boiling point of 158° C. and 1-octanol having a boiling point of 195° C.

Examples of alkylene glycols include diol-type solvents such as ethylene glycol, diethylene glycol, triethylene glycol, propylene glycol, dipropylene glycol and 1,3-butylene glycol.

Examples of glycol ethers include ethylene oxides such as ethylene glycol monobutyl ether, diethylene glycol monomethyl ether, diethylene glycol monoethyl ether and diethylene glycol monobutyl ether; and propylene oxides such as propylene glycol monomethyl ether, propylene glycol monobutyl ether and dipropylene glycol monomethyl ether.

Among them, it is preferable to use a compound having a sufficiently high boiling point in terms of printability, such as ethylene glycol, diethylene glycol, diethylene glycol monobutyl ether and dipropylene glycol monomethyl ether.

Two or more of these solvents can be mixed with each other.

The content of the organic solvent having hydroxy groups and a boiling point of 120° C. or higher based on the total amount of polyimide resin surface modifier of the present invention is preferably 30-99.9% by weight, more preferably 50-99% by weight, most preferably 80-99% by weight. By adjusting the content of the organic solvent in this range, suitable printability can be given to the polyimide resin surface modifier.

(3) Water Content

The polyimide resin surface modifier of the present invention contains the organic solvent having hydroxy groups and a boiling point of 120° C. or higher as a main solvent, and has the water content of 0-10% by weight, preferably 0-5% by weight.

When the water content in the polyimide resin surface modifier is more than 10% by weight, dissociation of the alkali component might progress by the action of water, which might cause enhancement of alkaline property of the polyimide resin surface modifier to give serious damage to printers, and as a result, to deteriorate the precision of pattern print significantly and/or to shorten the life of printers.

According to the polyimide resin surface modifier of the present invention, it is preferable that water is contained as few as possible. It is most preferable that the water content is 0% by weight. However, there are cases that the presence of water derived from impurities contained in raw materials and/or moisture absorption of raw materials or the modifier itself is ascertained. Therefore, it is actually difficult to make the water content be 0% by weight. In fact, the water content in the range of 10% by weight or less, more preferably 5% by weight or less based on the amount of the polyimide resin surface modifier of the present invention is an allowable range to achieve the purpose of the present invention.

When the water content is 10% by weight or less and the main component is the organic solvent, since the ionization state of water molecule in large amounts of organic solvent is different from that in water solvent, the influence of water contained on the activity of alkali components is thought to be small.

The purpose of the present invention is to provide a modifier wherein the alkali component acting for modifying polyimide is in the state not exhibiting alkali property to a degree of damaging to a printer. One of the indicators showing the achievement degree of the purpose is the water content in the modifier. The modifier having the water content of 10% by weight or less can achieve the purpose of the present invention.

(4) Water-Soluble Polymer Compound

The polyimide resin surface modifier of the present invention can contain a water-soluble polymer compound. The water-soluble polymer compound used in the present invention is a compound which is soluble in the organic solvent and also in water.

Blending a water-soluble polymer compound into the polyimide resin surface modifier enables to control viscosity thereof extensively. As a result, it enables to control viscosity thereof so as to optimize for various printing processes and to prevent missing and/or bleeding of print. Thus, printing precision can be improved to a large extent.

In addition, by bringing the modifier into contact with water after printing, the water-soluble polymer compound in the polyimide resin surface modifier can take water therein to promote dissociation of alkali component, which brings the specific progress of modification reaction of the printed part. Furthermore, the polyimide resin surface modifier can be removed with ease, since the water-soluble polymer compound is soluble in water.

Preferable examples of the water-soluble polymer compounds used in the polyimide resin surface modifier of the present invention include a synthetic polymer compound such as polyvinyl pyrrolidone, polyvinyl alcohol, carboxy methylcellulose, hydroxy ethylcellulose, polyethylene oxide, sodium polyacrylate, polyacrylamide and polyethyleneimine, and a natural polymer compound such as cornstarch, mannan, pectin, chitosan, agar, sodium alginate, hyaluronic acid, sericin, various gums, dextran and gelatin.

Among them, it is preferable to use a compound selected from the group consisting of polyvinyl pyrrolidone, polyvinyl alcohol and carboxy methylcellulose in terms of excellent alkaline resistance. It is particularly preferable to use polyvinyl pyrrolidone.

In the case of using a water-soluble polymer compound, the content thereof is preferably 0.1-60% by weight, more preferably 0.5-50% by weight, further preferably 1-10% by weight based on the total amount of the polyimide resin surface modifier of the present invention.

The polyimide resin surface modifier of the present invention can be used in combination with components suitable for the printing method employed. In the case of using the modifier for screen printing, for example, the viscosity suitable for screen printing can be imparted by adding additives such as pigments, inorganic fine particles or fillers, rheology controlling agents and dispersion stabilizers.

In the case of using the modifier for inkjet printing, viscosity, surface tension and discharging performance can be controlled by blending pigments, inorganic fine particles or fillers, leveling agents, dispersion stabilizers, defoaming agents or the like.

Known additives can be used as these components. Examples of pigments and inorganic fine particles or fillers include talc, bentonite, zirconium silicate, silica, nickel oxide, aluminum oxide, barium sulfate, barium carbonate, potassium carbonate, zinc oxide and titanium oxide.

The content of these components is not particularly limited and can be determined appropriately in accordance with the use. The preferable content of the components is preferably 0.5-500% by weight, more preferably 1-300% by weight based upon the amount of the polyimide resin surface modifier of the present invention.

2. Surface-Modifying Method for Polyimide Resin

The surface-modifying method for polyimide resin using the polyimide resin surface modifier of the present invention, as shown in FIG. 1 as one embodiment thereof, comprises:

a printing process wherein a predetermined pattern is printed on the surface of a polyimide resin substrate using a polyimide resin surface modifier of the present invention (see Process (a) in FIG. 1)

an organic solvent-removing process wherein an organic solvent in the polyimide resin surface modifier pattern-printed on the surface of said polyimide resin substrate is removed (see Process (b) in FIG. 1) and a water-treatment process wherein said polyimide resin surface modifier after removing the organic solvent is brought into contact with water (see Process (c) in FIG. 1).

By employing the method of printing a predetermined pattern using the polyimide resin surface modifier containing an organic solvent as a main solvent and then removing said organic solvent, a predetermined pattern can be formed easily on the surface of polyimide resin substrate by using a modifier wherein the alkali component acting for modifying polyimide is in the state not exhibiting alkali property to a degree of damaging to a printer. Therefore, modification can be performed by forming a predetermined fine pattern reliably on the surface of a polyimide resin without damaging to a printing plate and/or printer by an alkali component in the printing process.

The surface-modifying method for polyimide resin of the present invention will be described below with respect to each process.

(1) Printing Process

According to the method of the present invention, the printing process is carried out firstly (see Process (a) in FIG. 1). According to the Process (a), the above-mentioned polyimide resin surface modifier is used as ink, and the predetermined pattern is printed by various printing methods on the surface of polyimide resin substrate. Since the polyimide resin surface modifier of the present invention has the water content of 0-10% by weight and its alkaline property is extremely week, it does not exhibit alkaline property at the time of printing, and as a result, it does not give damage to a printing plate and/or a printer in the printing process carried out at room temperature.

Examples of printing methods include screen printing, gravure printing, gravure offset printing, inkjet printing and flexographic printing. Examples of printers include various known printers such as a screen printer, a gravure printer, a gravure offset printer, an inkjet printer and a flexographic printer.

(2) Organic Solvent-Removing Process

According to the organic solvent-removing process, the organic solvent having hydroxy groups and a boiling point of 120° C. or higher contained in the polyimide resin surface modifier pattern-printed on the surface of polyimide resin substrate is removed (see Process (b) in FIG. 2).

The method for removing the organic solvent is not particularly limited, and various methods for drying can be employed. Examples of the methods for drying include drying under heating, drying in a warm air flow and drying under reduced pressure. Drying under heating is preferably employed. By removing the organic solvent, the polyimide resin surface modifier printed in a pattern shape loses fluidity, whereby the pattern shape to be modified on the surface of polyimide resin substrate is determined. When removing the organic solvent by drying under heating, heat treatment can be carried out at preferably 40-200° C., more preferably 100-180° C., for 1-120 minutes, more preferably 1-60 minutes.

According to the present invention, in the case of employing the method of drying under heating for removing the organic solvent, modification reaction on the surface of polyimide resin substrate may be progressed by the alkali component contained in the polyimide resin surface modifier.

While the precise chemical reaction mechanism may not be clearly known, it can be presumed that said progress of modification reaction is a result where modification by water contained in the modifier as an impurity or by a small amount of water absorbed in the modifier from the air after the printing process and/or the organic solvent-removing process is promoted by heating.

(3) Water Treatment Process

According to the method of the present invention, after the above-mentioned organic solvent-removing process, a water treatment process wherein the polyimide resin surface modifier after removing the organic solvent is brought into contact with water is carried out (see Process (c) in FIG. 1).

By bringing into contact with water, alkali component in the polyimide resin surface modifier on the polyimide resin substrate, wherein the main component is a remaining alkali component after removing the organic solvent, is dissociated by water and alkali hydrolysis reaction (modification reaction) of the polyimide resin is progressed.

By adjusting the temperature and time of contacting with water, the modification degree on the surface of polyimide resin can be controlled.

In the water treatment process, the polyimide resin surface modifier may be removed after modification of the surface of polyimide resin substrate, and in this case, said water treatment process can be a process doubling as a water washing process (see Process (d) in FIG. 1) described below.

In the particular case of surface-modifying method using the polyimide resin surface modifier containing a water-soluble polymer compound, the water treatment process is especially important, since the water-soluble polymer compound in the polyimide resin surface modifier can take water therein to promote dissociation of alkali component, and thus, surface modification reaction of the printed part on the polyimide resin substrate can be progressed specifically.

In addition, since the rate of alkali component is relatively decreased by blending a water-soluble polymer compound, contacting with water is required in order that surface modification is performed in a more convincing way.

Since the water-soluble polymer compound is soluble in water, the polyimide resin surface modifier can be removed easily by water treatment. By selecting the alkali component in the polyimide resin surface modifier appropriately, washing with water can be doubling as the above-mentioned water treatment process.

Examples of the methods for contacting with water include a dipping method wherein a polyimide resin substrate is dipped or immersed in water, a spraying method wherein water is sprayed on the surface of polyimide resin substrate by a spraying apparatus, a water-dropping method, a water-vapor adsorbing method wherein the polyimide resin substrate is brought into contact with water vapor by leaving said substrate in moisture environment, a method of contacting the surface of polyimide resin substrate with gel or a wet cloth and an ultrasonic processing method wherein ultrasonic wave is irradiated in water. Among them, it is preferable to employ a water dipping method or a water-vapor adsorbing method. It is most preferable to employ a water dipping method. Details about the water dipping method and the water-vapor adsorbing method are described below.

a) Water-Dipping Method

The water dipping method used in the present invention is a method wherein a polyimide resin substrate is dipped or immersed in water. By adjusting the temperature and/or time of dipping in water, the degree of surface modification can be controlled. It is preferable to dip the substrate in water at 10° C. or higher for 5 seconds or longer, more preferably to dip the substrate in water at 20° C. or higher for 90 seconds or longer, most preferably to dip the substrate in water at 21° C. for 90 seconds, whereby the surface modification reaction on the polyimide resin substrate can be promoted sufficiently. By dipping in water, the surface modification degree of the polyimide resin substrate can be improved dramatically to the degree of 3 times or more compared with that in the case of not dipping in water.

In addition, it is possible to use another dipping method of dipping in an arbitrary aqueous solution, since a similar effect can also be obtained by using an aqueous solution wherein some sort of solute is dissolved. In order to prevent undesirable chemical changes on the surface of polyimide resin, it is preferable to use a solution with pH of 9 or lower, preferably neutral pH or lower. It is most preferable to use pure water which is not affected by ions.

Examples of arbitrary aqueous solutions include various buffer solutions. In the case of modifying a polyimide resin elongated film continuously, for example, there is a benefit of using a buffer solution. That is, when a water treatment process is carried out by passing the polyimide resin elongated film through a tank storing water, a part of the surface of film that should not be modified originally might be modified by the increase in pH of the water stored in tank caused by dropping out of apart of the alkali component in the modifier to the water stored in tank during the water treatment.

Examples of the buffer solutions include a phosphate buffer solution, a citrate buffer solution, a borate buffer solution and Tris buffer.

b) Water-Vapor Adsorbing Method

According to the water-vapor adsorbing method, after printing the polyimide resin surface modifier on the polyimide resin substrate and removing the organic solvent in the modifier by volatilizing, the polyimide resin substrate is brought into contact with water vapor by leaving said substrate in moist air so that water vapor is adsorbed in the modifier thereon. Subsequently, modification is progressed by heating the substrate. This method is characterized in that the substrate does not contact with liquid water directly. The modification degree on the polyimide resin can be controlled by adjusting the temperature and humidity of moist air, the time of leaving and the temperature and time of heating.

For example, water-vapor adsorption can be carried out at room temperature and normal humidity, preferably at a temperature of 10-40° C. and humidity of 30-90%. The time of leaving is preferably in the range from 1 minute to 24 hours depending on the condition of air.

The heat treatment can be carried out at preferably 40-200° C., more preferably 100-180° C., for 1-120 minutes, more preferably 1-60 minutes.

In addition, the modification degree on the polyimide resin can be controlled by repeating the cycle of a combination process of water-vapor adsorption in air and heat treatment more than once. In this case, it is preferable to repeat the above cycle of combination process 2-10 times.

In the case of employing the water-vapor adsorbing method for the water treatment process in the present invention, since the modifier is not removed at the time of water treatment, the modifier is removed at the time of water washing process.

(4) Washing Process

After finishing necessary modification in the water treatment process of the present invention, it is possible to wash the surface of polyimide resin substrate by an adequate solvent so that the polyimide resin surface modifier is not remained on the modified part of the surface of polyimide resin substrate after modification (washing process (d) in FIG. 1).

In terms of plate adhesiveness and/or uniform deposition selectivity, it is desirable that components of polyimide resin surface modifier are not remained at the time of applying catalysts and depositing to the modified part of the polyimide resin substrate.

Examples of preferable solvents for washing include water. As a water-washing method, known washing methods can be employed. Examples of known washing methods include ultrasonic washing, spray and/or shower washing, brush washing, dip washing and two-fluid washing. These washing methods can be selected appropriately and are not particularly limited.

The washing process by water can be doubling as the above-mentioned water treatment process, especially the water treatment process by a water dipping method. Or, the washing process can be carried out in addition to the above-mentioned water treatment process subsequently, if necessary.

In the case of using a polyimide resin surface modifier containing a water-soluble polymer compound, it is possible to remove the polyimide resin surface modifier easily by washing with water, since the water-soluble polymer compound is soluble in water.

By selecting the alkali component in the polyimide resin surface modifier appropriately, the water washing process can be doubling as the above-mentioned water treatment process.

On the surface of the polyimide resin modified by the surface modifying method of the present invention, carboxy groups which are capable of adsorbing metal ions are generated. Metal salts can be formed by bringing a solution containing metal ions into contact with the carboxy groups on said surface. Subsequently, a metal film can be formed by reducing the metal salts and plating. As a result, a conductive pattern can be formed on the polyimide resin.

Examples of the metal ions include a palladium ion. Examples of the metal films include a nickel film and a copper film.

As a polyimide resin applicable in the present invention, it is preferable to use a polymer having heat resistance and chemical resistance in light of intended use as electronic materials, and having an imide ring skeleton such as polyimide and polyetherimide, wherein carboxy groups can be generated accompanied with ring-opening reaction of an imide ring in the main chain by alkali hydrolysis reaction.

Examples of polyimide resin substrates used in the present invention include a flexible printed-wiring board, a flexible sheet heater, a configurational wiring substrate, electromagnetic shielding materials, electrodes for solar cells, an antenna for IC tags, a flexible antenna and electrodes for lighting, which are formed of the above-mentioned polyimide resins.

EXAMPLES

The present invention will be described in more detail below referring to Examples and Comparative Examples, which are not intended to limit the scope of the present invention.

Examples 1-2, Comparative Examples 1-3

Effects of surface modification of polyimide resins printed by screen printing using polyimide resin surface modifiers of Examples 1-2 and Comparative Examples 1-3 shown in Table 1 were evaluated.

Evaluations were performed on modification property of polyimide resins, damages to a screen printer and a pattern printing property of screen printing.

The surface modifiers used here had been proved to show alkalinity of pH 10 or higher when measured after being diluted 100 times with water. It means that each of the surface modifiers themselves has a sufficient ability to modify a polyimide resin under the presence of a sufficient quantity of water to dissociate an alkali component to show an alkaline property.

In the case of Examples and Comparative Examples wherein water was not added intentionally, the content of water in each polyimide resin surface modifier shown in Table 1 means the content of water derived from raw materials or incorporated by moisture adsorption from the air unintentionally.

The content of water incorporated by moisture adsorption from the air was calculated by the rate of increase in weight when 2 ml of the polyimide resin surface modifier was left in the open air at room temperature for 4 hours.

The content of water derived from raw materials was determined with reference to the literatures concerned or the like.

In the case of Examples and Comparative Examples wherein water was added intentionally, the content of water shown in Table 1 does not comprise water derived from raw materials or incorporated by moisture adsorption from the air unintentionally.

(Evaluation of Modification Property of Polyimide Resin)

2 μL of polyimide resin surface modifier was dropped onto a polyimide film, brand name "Kapton 100H" manufactured by DU PONT-TORAY CO., LTD., and heat treatment was carried out at 150° C. for 20 minutes to remove the organic solvent in the polyimide resin surface modifier.

After heat treatment, the polyimide resin surface modifier remained on the film was removed by washing by means of shower washing using water.

Subsequently, modifying property on the part of being heat treated was evaluated by a Fourier transform infrared spectrophotometer (FT-IR). The measurement by FT-IR was carried out by an ATR method and a ratio of the adsorption strength at 1718.3 $cm^{-1}$ derived from an imide ring to the adsorption strength at 1502.3 $cm^{-1}$ derived from a benzene ring on the part of being modified was calculated, which was taken as an imide ring-residual degree. Based on said imide ring-residual degree, the ratio of the imide ring-residual degree for heat-treated polyimide to the imide ring-residual degree of untreated polyimide which was denoted as 100% was calculated and the result was taken as an imide ring-residual ratio. The imide ring-residual ratio was taken as an index of modification property, and modification property of a polyimide resin was evaluated based on the following standard:

○: the imide ring-residual ratio after heating was less than 50%.

Δ: the imide ring-residual ratio after heating was in the range between 50% or more and less than 75%.

X: the imide ring-residual ratio after heating was 75% or more.

(Evaluation of Damage to Screen Printer)

A photosensitive emulsion was applied on a stainless mesh so as to form lines having a width of 540 μm and a space of 200 μm, and thereby, a screen mask in the form of strip having the line width of 200 μm was formed.

A segment of the screen mask was immersed into a polyimide resin surface modifier for 3 hours. Immediately after immersion, the screen mask segment was watched by a microscope to observe appearance changes of the photosensitive emulsion between before and after the immersion. At the same time, a swelling amount was measured by the change of space widths among the emulsion lines as follows.

(Measurement of Swelling Amount)

Photosensitive emulsion applied so as to form a line having a space width of 200 μm was immersed into a modifier, and then, the space width was measured again. The swelling amount was determined by calculating the difference between the space before immersing (=200 μm) and the space after immersing which was usually narrowed by swelling of the emulsion.

[Swelling Amount (μm)]=[S1(=200 μm)]−[S2 (μm)]

S1: Space before immersing
S2: Space after immersing

Based on these results, damages by the polyimide resin surface modifier to the screen mask were evaluated as follows:

Appearance Change of Photosensitive Emulsion;

○: No change in appearance was observed after immersion.

X: Changes such as change in color were observed after immersion.

Swelling Amount of Photosensitive Emulsion;
○: The swelling amount was less than 4 μm.
Δ: The swelling amount was in the range between 4 μm or more and less than 8 μm.
X: The swelling amount was 8 μm or more.
(Evaluation of Pattern Printing Property by Screen Printing)

Only in the case of evaluation of pattern printing property by screen printing, a polyimide resin surface modifier wherein a thickening component was added to impart adequate viscosity was used. That is, a thickening component prepared by blending polyvinyl pyrrolidone, brand name "K-30", manufactured by NIPPON SHOKUBAI CO., LTD., which has thickening abilities for the organic solvent in said modifier and zirconium silicate which can be dispersed in the organic solvent by the ratio of [polyvinyl pyrrolidone]:[zirconium silicate]=35:65 (weight ratio) was added to the modifier by the ratio of 1 based on 1 of the modifier (weight ratio), so as to have viscosity of 20-150 Pa·s under the shear rate of 10 s$^{-1}$ at 25° C.

By using the polyimide resin surface modifier thus thickened and by using a screen mask formed into an arbitrary pattern having a pattern size of 150 mm×150 mm, screen printing on the polyimide resin film was carried out 20 times continuously.

After printing, printing blurring on a part of being patterned and bleeding of solvent under the screen mask were observed. Pattern printing property of the modifier was evaluated as follows:
○: No blurring or bleeding was observed after continuous printing of 20 times.
X: Blurring and/or bleeding were observed after continuous printing of 20 times.

examples had modification property of polyimide resin and was excellent in screen printing property, whereas no damage to a printer was observed.

On the other hand, in the case of using the polyimide resin surface modifiers used in Comparative Examples 1-3, damages to the screen printer such as color change and/or swelling in the emulsion of screen mask were observed. For pattern printing property of ink, in addition, blurring and/or bleeding were also observed.

Examples 3-7, Comparative Examples 4-5

Using the polyimide resin surface modifiers having the compositions shown in Table 2, effects of surface modification of polyimide resin by inkjet printing were evaluated.

Modification property of polyimide resin was evaluated in the same manner as in Examples 1-2.

In addition to the modification property, damages to an inkjet printer and ink discharging stability in an inkjet head were evaluated as an evaluation of inkjet printing property as described below. The surface modifiers used here had been proved to show alkalinity of pH 10 or higher when measured after being diluted 100 times with water.
(Evaluation of Damage to Inkjet Printer)

Change in liquid repellency of an orifice plate surface resin by contacting with the polyimide resin surface modifiers was checked. Firstly, the water contact angle on the orifice plate surface resin was measured and subsequently the orifice plate surface resin was brought into contact with a polyimide resin surface modifier at room temperature for 24 hours. Then, the water contact angle on the orifice plate surface resin was measured again. In accordance with the

TABLE 1

| | Content of Component(*1) | | | | Damage to Printer | | Pattern |
|---|---|---|---|---|---|---|---|
| | Component | (% by weight) (converted value to koh) | Water Content (% by weight) | Modification Property | Change in Appearance | Swelling Amount | Printing Property |
| Example 1 | DEGMBE | 92 | 0.6 | ○ | ○ | ○ | ○ |
| | TBAH | 8(1.7) | | | | | |
| Example 2 | DEG | 98 | 9.7 | ○ | ○ | ○ | ○ |
| | KOH | 2 | | | | | |
| Comp. Ex. 1 | Water | 98 | 98 | ○ | X | X | X |
| | KOH | 2 | | | | | |
| Comp. Ex. 2 | MeOH | 92 | No Data | ○ | X | Δ | X |
| | TBAH | 8(1.7) | (*2) | | | | |
| Comp. Ex. 3 | DEG | 68 | 30 | ○ | X | X | X |
| | Water | 30 | | | | | |
| | KOH | 2 | | | | | |

The abbreviations in the above Table 1 mean as follows:
DEGMBE: Diethylene glycol monobutyl ether (boiling point: 188.3° C.)
DEG: Diethylene glycol (boiling point: 244.3° C.)
MeOH: Methanol which is a special grade reagent manufactured by NACALAI TESQUE, INC. (boiling point: 64.7° C.)
Water: (boiling point: 100° C.)
KOH: Potassium Hydroxide
TBAH: Tetrabutylammonium hydroxide
(*1) The value provided in parenthesis for the content of TBAH is a content of TBAH in terms of a converted value to KOH (% by weight).
(*2) No Data means that the water content was not determined since the water content of methanol used was not clear.

According to the results of the above Examples 1 and 2, each of the polyimide resin surface modifiers used in these decreasing rate of water contact angle on the orifice plate surface resin, damage to an inkjet head was evaluated as follows:
○: The decreasing rate of water contact angle was less than 5%.
Δ: The decreasing rate of water contact angle was in the range between 5% or more and less than 20%.
X: The decreasing rate of water contact angle was 20% or more.
(Evaluation of Ink Discharging Stability)

By using a polyimide resin surface modifier as an ink, a 20=long line was printed by discharging said ink from an inkjet head. Then, the number of breaking places in the printed line was counted and ink discharging stability was evaluated based on the number of breaking places.

Only in the case of evaluation of ink discharging stability, a polyimide resin surface modifier wherein a thickening component was added to impart adequate viscosity was used in Example 3, Example 4, Comparative Example 4, and Comparative Example 5. That is, polyvinyl pyrrolidone, brand name "K-30", manufactured by NIPPON SHOKUBAI CO., LTD., which has thickening abilities for the organic solvent in said modifier was added to the modifier by the ratio of 1 based on 100 of the modifier (weight ratio, approximately 1% by weight), so as to have viscosity of 5-12 mPa·s at 30° C.

With regard to Examples 5, 6 and 7, polyvinyl pyrrolidone was not added to the modifiers since each of the modifiers used already had viscosity of 5-12 mPa·s without adding polyvinyl pyrrolidone.

Evaluation of ink discharging stability was performed by the following standard:
◯: The number of breaking places was less than 0.05/mm.
Δ: The number of breaking places was in the range between 0.05/mm or more and less than 0.5/mm.
X: The number of breaking places was 0.5/mm or more.

In Examples 3-7, the polyimide resin surface modifiers exhibited excellent ink discharging stability and modification property of polyimide resin without damaging to a printer.

In Comparative Examples 4-5, on the other hand, the polyimide resin surface modifiers damaged to a printer and exhibited inferior ink discharging stability.

Preparation Examples 1-5

Polyimide resin surface modifier compositions containing water-soluble polymer compounds each having a composition ratio shown in the following Table 3 were prepared (hereinafter, Compositions 1-5). Polyvinyl pyrrolidone, brand name "PVP K-90", manufactured by NIPPON SHOKUBAI CO., LTD., was used for a water-soluble polymer compound.

Tetrabutylammonium hydroxide (TBAH), which was a TBAH-37% methanol solution manufactured by Tokyo

TABLE 2

|  | Component | Content of Component(*1) (% by weight) (converted value to KOH) | Water Content (% by weight) | Modification Property | Damage to Printer | ink discharging Stability |
|---|---|---|---|---|---|---|
| Example 3 | DPGMME | 92 | 0.6 | ◯ | ◯ | ◯ |
|  | TBAH | 8(1.7) |  |  |  |  |
| Example 4 | DEGMBE | 98 | 7.2 | ◯ | ◯ | ◯ |
|  | KOH | 2 |  |  |  |  |
| Example 5 | DPGMME | 67.5 | 7.3 | ◯ | ◯ | ◯ |
|  | EG | 30 |  |  |  |  |
|  | KOH | 2.5 |  |  |  |  |
| Example 6 | EGMBE | 72 | 4.2 | ◯ | ◯ | ◯ |
|  | EG | 25 |  |  |  |  |
|  | KOH | 3 |  |  |  |  |
| Example 7 | EGMME | 72 | 0.5 | ◯ | ◯ | ◯ |
|  | EG | 25 |  |  |  |  |
|  | KOH | 3 |  |  |  |  |
| Comp. Ex. 4 | Water | 98 | 98 | ◯ | X | X |
|  | KOH | 2 |  |  |  |  |
| Comp. Ex. 5 | i-PrOH | 92 | No Data | Δ | Δ | X |
|  | TBAH | 8(1.7) | (*2) |  |  |  |

The abbreviations in the above Table 2 mean as follows:
DPGMME: Dipropylene glycol monomethyl ether (boiling point: 230.4° C.)
DEGMBE: Diethylene glycol monobutyl ether (boiling point: 188.3° C.)
DEG: Diethylene glycol (boiling point: 244.3° C.)
EGMBE: Ethylene glycol monobutyl ether (boiling point: 171° C.)
EGMME: Ethylene glycol monomethyl ether (boiling point: 124° C.)
EG: Ethylene glycol (boiling point: 197.3° C.)
MeOH: Methanol which is a special grade reagent manufactured by NACALAI TESQUE, INC. (boiling point: 64.7° C.)
i-PrOH: Isopropanol (boiling point: 82.4° C.)
Water: (boiling point: 100° C.)
KOH: Potassium Hydroxide
TBAH: Tetrabutylammonium hydroxide
(*1) The value provided in parenthesis for the content of TBAH is a content of TBAH in terms of a converted value to KOH (% by weight).
(*2) No Data means that the water content was not determined since the water content of methanol used was not clear.

Chemical Industry Co., Ltd., and potassium hydroxide manufactured by NACALAI TESQUE, INC. were used for an alkali component.

Diethylene glycol, manufactured by NACALAI TESQUE, INC., and dipropylene glycol monomethyl ether, manufactured by NACALAI TESQUE, INC., were used for an organic solvent.

Talc, brand name of "FG-15", manufactured by Nippon Talc Co., Ltd.; bentonite, brand name of "SD-2", manufactured by Toshin Chemicals Co., Ltd.; zirconium silicate, brand name of "Micropax SPZ", manufactured by HakusuiTech Co., Ltd.; and nickel oxide, manufactured by Tanaka Chemical Corporation; were used for a filler component.

In the case of a composition wherein water was not added intentionally, the water content of each polyimide resin surface modifier composition shown in Table 3 was calculated based on the water content derived from raw materials or incorporated by moisture adsorption from the air unintentionally.

The content of water incorporated by moisture adsorption from the air was calculated by the rate of increase in weight when the polyimide resin surface modifier composition was left in the open air at room temperature (21° C.) for 2 hours.

The content of water derived from raw materials was determined with reference to the literatures concerned or the like.

In the case of a composition wherein water was added intentionally, the water content shown in Table 3 comprise not only the amount of water added intentionally, but also the amount of water derived from raw materials or incorporated by moisture adsorption from the air unintentionally.

less did not give damage to the screen mask. In the case of using a composition having the water content of more than 10% by weight, on the other hand, damage to the screen mask accompanied by change in appearance of a photosensitive emulsion might occur.

TABLE 3 unit: % by weight

| | | | Composition 1 | Composition 2 | Composition 3 | Composition 4 | Composition 5 |
|---|---|---|---|---|---|---|---|
| Polyimide Resin Surface Modifier | Polymer Compound | PVP | 2.8 | 8.6 | 5.7 | 9.1 | 6.5 |
| | Alkali Component | TBAH (converted value to KOH) | 3.4 (0.73) | — | — | — | — |
| | | KOH | — | 1.3 | 1.6 | 1.5 | 1.0 |
| | Organic Solvent | DEG | 16.9 | 90.0 | 92.7 | 89.3 | 17.5 |
| | | DPGMME | 76.9 | — | — | — | — |
| | Water | | — | — | — | — | 75.0 |
| | Total | | 100 | 100 | 100 | 100 | 100 |
| | Water Content | | 4.2 | 2.6 | 2.9 | 4.6 | 75.5 |
| Filler | Talc | | 11.2 | — | 78.6 | — | — |
| | Bentonite | | 1.2 | — | — | — | — |
| | Zirconium Silicate | | — | 231.1 | — | — | 150.0 |
| | Nickel Oxide | | — | — | — | 407.1 | — |

The abbreviations in the above Table 3 mean as follows:
PVP: Polyvinyl pyrrolidone
DPGMME: Dipropylene glycol monomethyl ether (boiling point: 230.4° C.)
DEG: Diethylene glycol (boiling point: 244.3° C.)
KOH: Potassium Hydroxide
TBAH: Tetrabutylammonium hydroxide Examples 8-9, Comparative Example 6

The Compositions 1, 2 and 5 shown in the above Table 3 were subjected to evaluation of damage to a screen printer by means of the following method:
(Evaluation of Damage to Screen Printer)
A photosensitive emulsion was applied on a stainless mesh to form a screen mask in the form of a strip line having the line width of 200 μm.
A segment of the screen mask was brought into contact with each of the Compositions 1, 2 and 5 for 3 hours. The screen mask segment was watched by a microscope to observe appearance changes of the photosensitive emulsion between before and after the contact. At the same time, a swelling amount was measured by the change of space widths among the emulsion lines in the same manner as in Examples 1-2.
Based on these results, damage by the compositions to the screen mask was evaluated as follows:
○: No change in appearance was observed after contact.
X: Changes such as change in color were observed after contact.

TABLE 4

| | Ex. 8 | Ex. 9 | Comp. Ex. 6 |
|---|---|---|---|
| Composition | Composition 1 | Composition 2 | Composition 5 |
| Water Content (% by weight) | 4.2 | 2.6 | 75.5 |
| Damage to Screen Mask | ○ | ○ | X |

As shown in the above results, it was clear that the compositions having the water content of 10% by weight or Examples 10-13

Using Compositions 1-4 shown in the above Table 3, modification treatment on a polyimide resin substrate was carried out and evaluation was performed.
Each of Compositions 1-4 was printed by screen printing on a polyimide resin film substrate having a film thickness of 25 μm, brand name "Kapton 100H" manufactured by DU PONT-TORAY CO., LTD., to form a linear pattern (Printing Process). Subsequently, the polyimide resin substrate was subjected to a drying process in a 150° C. oven for 30 minutes (Organic Solvent Removing Process).
After the drying process, the polyimide resin substrate was immersed into water at 21° C. for 90 seconds to be brought into contact with water to be modified (Water Treatment Process). Then, the composition was removed by ultrasonic cleaning in pure water for 3 minutes (Washing Process). In this manner, the surface modification of the polyimide resin substrate was carried out by the organic solvent removing process, the water treatment process and the washing process.
Chemical changes on the surface of the polyimide resin substrate before and after the modification by the above-mentioned processes was measured by a Fourier transform infrared spectrophotometer (FT-IR) and the rate of modification on the surface of polyimide resin was made to be numerical values. Plating deposition ability was evaluated by observing the appearance after electroless nickel plating. Durability of printed materials on the polyimide resin and removal performance were also evaluated by observation. The results were shown in Table 5.
(Numerical Values of Rate of Modification)
After the compositions were printed and modification treatment was carried out on the surface of polyimide resin, the surface was subjected to measurement by a Fourier transform infrared spectrophotometer (FT-IR) to obtain an absorption spectrum. The absorption peak strength at 1718.3 $cm^{-1}$ derived from an imide ring (hereinafter, "Abs-imide ring") and the absorption peak strength at 1502.3 $cm^{-1}$ derived from a benzene ring (hereinafter, "Abs-benzene ring") were used to calculate an absorption peak strength rate of imide ring to benzene ring ([Abs-imide ring]/[Abs-benzene ring]). The value of the absorption peak strength rate thus obtained was represented by "[Abs*]".

The absorption peak strength rate of the polyimide resin before modification treatment which was represented by "[Abs*]$_0$" was used as a standard to calculate a rate of change to the absorption peak strength rate of the polyimide resin after modification treatment in each Examples and Comparative Examples which was represented by "[Abs*]". Thereby, the rate of imide rings opened by alkali hydrolysis or the degree of progress of modification reaction was made to be numerical value, which was represented as a rate of modification (%).

(Evaluation of Plating Deposition)

After the compositions were printed and modification treatment was carried out on the surface of polyimide resin substrate, the substrate was subjected to catalyst application, reduction, electroless nickel plating and a pattern plate was deposited on the surface of polyimide resin. In the catalyst-application process, the substrate was immersed into a 0.15 g/L palladium chloride solution at 40° C. for 3 minutes. In the reducing process, the substrate was immersed into a 0.02M dimethylamine borane solution with a pH5.8 citrate buffer at 40° C. for 3 minutes. In the plating process, the substrate was immersed into an electroless nickel plating bath, brand name "ES-500", manufactured by JCU CORPORATION, at 40° C. for 1 minute.

Plating deposition on the surface of the polyimide resin after modification was evaluated as follows:
◯: Excellent in deposition
Δ: Deposited with lacking in uniformity
X: Defect in deposition (Evaluation of Durability in Printed Material)

The compositions were printed on a polyimide resin substrate and were subjected to a drying process (Printing Process and Organic Solvent Removing Process) to form a linear pattern printed material. The polyimide resin substrate having the linear pattern printed material thereon was blended 5 times in a direction vertical to the linear pattern, and then, form change of the printed material was observed to evaluate.

◯: No change in the form of printed material by bending the substrate was observed.
Δ: Cracking or falling off of the printed material by bending the substrate was observed.

X: Cracking or falling off of the printed material on the polyimide resin substrate was observed at the time of drying.

(Removal Performance)

Each of the compositions was printed on a polyimide resin substrate "Kapton 100H" by using a screen printing plate of a stripe pattern. Subsequently, the substrate was subjected to a drying process in an oven at 120° C. for 30 minutes (Organic Solvent Removing Process), and was immersed into pure water at 21° C. for 90 seconds (water treatment process or modification by contacting with water). Then, the substrate was subjected to ultrasonic cleaning in pure water at a frequency of 40 kHz for 10 minutes.

The surface of the polyimide resin substrate was observed by a microscope of 100 magnifications and the presence or absence of residues was evaluated.

◯: No residues was observed.
X: Presence of residues was observed.

TABLE 5

|  | Example 10 | Example 11 | Example 12 | Example 13 |
| --- | --- | --- | --- | --- |
| Compound | Compound 1 | Compound 2 | Compound 3 | Compound 4 |
| Alkali Component | TBAH | KOH | KOH | KOH |
| Polymer Compound | Water Soluble | Water Soluble | Water Soluble | Water Soluble |
| Immerse to Pure Water | 21° C. | 21° C. | 21° C. | 21° C. |
|  | 90 sec | 90 sec | 90 sec | 90 sec |
| Rate of Modification (%) | 31 | 72 | 60 | 59 |
| Removal Performance | ◯ | ◯ | ◯ | ◯ |
| Plate Deposition | ◯ | ◯ | ◯ | ◯ |
| Durability of Printed Material | ◯ | ◯ | ◯ | ◯ |
| Water Content (%) | 4.2 | 2.6 | 2.9 | 4.6 |

In light of the above results, it was clear that the modification degree on the polyimide resin was improved and uniform plate deposition was ensured by using a polyimide resin surface modifier composition containing a water-soluble polymer compound of the present invention. In addition, sufficient durability of printed materials was also ensured by using said polyimide resin surface modifier composition containing a water-soluble polymer compound. Furthermore, the polyimide resin surface modifier composition containing a water-soluble polymer compound was entirely removed from the surface of polyimide resin substrate by a removing process using water.

Examples 14-22

Composition 1 or 2 was used to print on a polyimide resin substrate "Kapton 100H" by screen printing, and the substrate was subjected to a drying process in an oven at 150° C. for 30 minutes. Subsequently, the substrate was subjected to a water treatment process using various water-contacting methods such as a dipping method, a spray method, a wet cloth-contacting method, a dropping method, a gel-contacting method and an ultrasonic processing as described below, and then, modification promoting effect was evaluated.

After modification, plating was carried out in the same manner as in Example 10 and various evaluations were performed in the same manner as described above. The results were shown in Table 6.

TABLE 6

|  | Ex. 14 | Ex. 15 | Ex. 16 | Ex. 17 | Ex. 18 | Ex. 19 | Ex. 20 | Ex. 21 | Ex. 22 |
| --- | --- | --- | --- | --- | --- | --- | --- | --- | --- |
| Compound | 2 | 1 | 1 | 1 | 2 | 2 | 2 | 2 | 2 |
| Water Contacting Method | Dip 21° C. | Dip 21° C. | Dip 21° C. | Dip 40° C. | Spray | Wet Cloth | Drop | Gel | Ultrasonic |
| Time of Contact | 90 sec | 60 sec | 180 sec | 90 sec | 90 sec | 90 sec | 90 sec | 90 sec | 0 sec |
| Rate of Modification (%) | 72 | 16 | 30 | 33 | 52 | 24 | 54 | 81 | 22 |
| Plate Deposition | ○ | Δ | ○ | ○ | ○ | ○ | ○ | ○ | ○ |
| Removal Performance | ○ | ○ | ○ | ○ | ○ | ○ | ○ | ○ | ○ |

The abbreviations in the above Table 6 mean as follows:

*Dip (a dipping method):

The printed material was immersed into pure water at 21° C. or 40° C., and after the lapse of prescribed time, ultrasonic cleaning was carried out in pure water.

*Spray (a spray method):

Pure water was sprayed onto the surface of printed material, and after the lapse of prescribed time, ultrasonic cleaning was carried out in pure water.

*Wet cloth (a wet cloth-contacting method):

A sheet of cloth, brand name "HydroCloth", was soaked in water. The surface of printed material was brought into contact with said cloth, and after the lapse of prescribed time, ultrasonic cleaning was carried out in pure water.

*Drop (a dropping method):

500 μL of pure water was dropped onto the printed material, and after the lapse of prescribed time, ultrasonic cleaning was carried out in pure water.

*Gel (a gel-contacting method):

Gel of 8% carboxy methylcellulose, brand name "Cellogen HE-600F", manufactured by Dai-Ichi Kogyo Seiyaku Co. Ltd., was prepared by using water. The surface of printed material was brought into contact with said gel, and after the lapse of prescribed time, ultrasonic cleaning was carried out in pure water.

*Ultrasonic (an ultrasonic processing):

Ultrasonic irradiation at a frequency of 40 kHz was carried out for 5 minutes while the printed material was immersed in pure water at 25° C.

Ultrasonic cleaning performed after contacting with water in each method was carried out by irradiating ultrasonic wave at a frequency of 40 kHz for 5 minutes while the printed material was immersed in pure water at 25° C.

Seeing the above results, in each case when various water-contacting methods were performed by using the polyimide resin surface modifier compositions containing water-soluble polymer compounds, sufficiently high rate of modification on the polyimide resin substrate was achieved and a uniform and even plating film was formed thereon.

INDUSTRIAL APPLICABILITY

According to the present invention, by using the above-mentioned polyimide resin surface modifier and the surface modifying method of polyimide resin using the same, damages to printing plates and/or printers can be suppressed, and opening of imide rings on the surface of polyimide resin substrate can be caused evenly and sufficiently. By adsorbing metal ions on the polyimide resin thus surface modified and by reducing the metal ions to form a metal film, a metal film pattern excellent in electromigration resistance can be obtained without under etching. Thus, the method of the present invention can be widely utilized for manufacturing circuit boards such as a flexible printed-wiring board.

The invention claimed is:

1. A surface-modifying method for a polyimide resin which comprises a printing process wherein a predetermined pattern is printed on the surface of a polyimide resin substrate using a polyimide resin surface modifier containing an alkali component and an organic solvent having hydroxy groups and a boiling point of 120° C. or higher wherein the water content is 0-10% by weight, an organic solvent-removing process wherein an organic solvent in the polyimide resin surface modifier pattern-printed on the surface of said polyimide resin substrate is removed and a water-treatment process wherein said polyimide resin surface modifier after removing the organic solvent is brought into contact with water.

2. The surface-modifying method for a polyimide resin according to claim 1, wherein said polyimide resin surface modifier further contains a water-soluble polymer compound.

3. The surface-modifying method for a polyimide resin according to claim 1, wherein said printing is carried out by a screen printing method.

4. The surface-modifying method for a polyimide resin according to claim 1, wherein said printing is carried out by an inkjet printing method.

5. The surface-modifying method for a polyimide resin according to claim 2, wherein said printing is carried out by a screen printing method.

6. The surface-modifying method for a polyimide resin according to claim 2, wherein said printing is carried out by an inkjet printing method.

7. The surface-modifying method for a polyimide resin according to claim 1, wherein said organic solvent-removing process is a process wherein an organic solvent in the polyimide resin surface modifier pattern-printed on the surface of said polyimide resin substrate is removed by heat treatment at 40-200° C. for 1-120 minutes.

8. The surface-modifying method for a polyimide resin according to claim 2, wherein said organic solvent-removing process is a process wherein an organic solvent in the polyimide resin surface modifier pattern-printed on the surface of said polyimide resin substrate is removed by heat treatment at 40-200° C. for 1-120 minutes.

* * * * *